United States Patent [19]

Hutchison

[11] Patent Number: 5,504,762
[45] Date of Patent: Apr. 2, 1996

[54] LASER DIODE SYSTEM WITH FEEDBACK CONTROL

[75] Inventor: Sheldon Hutchison, Sunnyvale, Calif.

[73] Assignee: Spectra-Physics Lasers, Inc.

[21] Appl. No.: 320,285

[22] Filed: Oct. 11, 1994

[51] Int. Cl.$^6$ .................................................. H01S 3/13
[52] U.S. Cl. ............................... 372/29; 372/108; 372/33; 372/20
[58] Field of Search ..................... 372/32, 6, 29, 372/38, 69, 33, 108, 20, 39, 97, 28

[56] References Cited

U.S. PATENT DOCUMENTS

| | | | |
|---|---|---|---|
| 4,053,764 | 10/1977 | Sierak et al. | 385/28 |
| 4,358,851 | 11/1982 | Scifres et al. | 372/97 |
| 4,381,137 | 4/1983 | Berg et al. | 385/28 |
| 4,547,664 | 10/1985 | Vogt et al. | 372/32 |
| 5,127,068 | 1/1992 | Baer et al. | 372/108 |
| 5,323,409 | 6/1994 | Laskoskie et al. | 372/6 |

Primary Examiner—Leon Scott, Jr.
Attorney, Agent, or Firm—Haynes & Davis

[57] ABSTRACT

A diode pumped laser system includes a laser cavity with an active laser medium. A laser diode, with an emitter region having an output facet that produces light at a frequency $\lambda_1$, is the pump source for the laser medium. A coupling optics is positioned on an emission path of radiation from the emitter region and is optically coupled and spaced from the diode. The coupling optics produces stray radiation. An optical fiber, with a first end and a second end, is included. The first end of the fiber is oriented with respect to the coupling optics such that radiation from the emitter region is optically coupled into the optical fiber. The second end of the fiber is coupled to the laser cavity. A detector is positioned in a spaced, adjacent relationship to the coupling optics along an emission path of the stray radiation. The detector detects at least a portion of the stray radiation and produces a detected output in response to the stray radiation. A signal processor is coupled to the detector, and receives the detected output to produce a processed output that is representative of a detected characteristic of the laser system.

31 Claims, 3 Drawing Sheets

LASER DIODE SYSTEM WITH FEEDBACK CONTROL

BACKGROUND OF THE INVENTION

1. Field of the Invention

This invention relates generally to diode pumped laser systems, and more particularly, to diode pumped laser systems with feedback control that includes diagnostics.

1. Description of the Related Art

It is desirable to be able to directly monitor various performance parameters of a diode pumped laser system. These performance parameters can include, but are not limited to, (i) power output, (ii) optical activity or output, (iii) wavelength detection and tuning indications, (iv) laser operation data of the pumped laser using light traveling back from the laser medium in the cavity to the diode pump source, (v) pulse output characteristics of pulse-driven diode pump sources and (vi) feedback from damaged optical fiber links for detection and diagnostic purposes.

Coupling optics have been used for coupling output emissions of a laser diode pump source to an optical fiber. An example of such a coupling optics is disclosed in U.S. Pat. No. 5,127,068; the "'068 patent", incorporated herein by this reference. In one embodiment disclosed in the '068 patent, radiation emitted from a laser diode bar, with a plurality of emitters, focused into multi-mode optical fibers, which may be part of an optical fiber bundle, includes placing coupling optics between the emitting facets of emitters, and the ends of the multi-mode optical fibers. The coupling optics can be a piece of a multi-mode optical fiber which can extend along the length of a diode bar pump source. The coupling optics is carefully positioned with respect to the output facets of the laser diode bar in order to properly collimate them. This is accomplished by aligning and securing it in place with a suitable epoxy.

Current diagnostic methods for such a system today are achieved by placing a beam sampling device in the path of the emitted light between the diode pump source and the coupling optics. This method presents two problems, (i) the distance between the diode pump source and the coupling optics is about 20 microns, and (ii) placing the sampling device in the path of the emitted light uses a good portion of the available light which is normally focused into the laser medium for pumping purposes. An example of a suitable sampling device is a beam splitter. Additionally, it is mechanically difficult to position a sampling device between the two elements. If the problem of limited space is ignored, building a feedback system would require extra mechanical components for stability. Such stability adds complexity to the feedback system and decreases the optical power output that is available from the laser diode source.

It would be highly desirable to provide a feedback system is much simpler than those currently proposed. There is a need for a feedback system that would not occupy the limited space, (i) between the diode pump source and the coupling optics or (ii) the coupling optics and fiber bundle or laser medium, and which does not use light intended for use in pumping the laser medium as part of the feedback system.

SUMMARY OF THE INVENTION

Accordingly, it is an object of the invention is to provide a diagnostic and control system for one or more detected characteristics of a diode pumped laser system.

Another object of the invention is to provide a feedback control system for a diode pumped laser system that does not occupy space between a diode pump source and a coupling optics of a diode pumped laser system.

Yet another object of the invention is to provide a feedback control system for a diode pumped laser system that does not use light from a diode pump source that is intended to pump a laser medium of the diode pumped laser system.

A further object of the invention is to provide a feedback control system for a diode pumped laser system that detects an indication of power output at the diode pump source.

Another object of the invention is to provide a feedback control system for a diode pumped laser system that detects an indication of wavelength emitted from the diode pump source.

A further object of the invention is to provide a feedback control system for a diode pumped laser system that detects an indication of laser diode wavelength tuning.

Another object of the invention is to provide a feedback control system for a diode pumped laser system that detects an indication of a pulse output of a diode pump source.

Another object of the invention is to provide a feedback control system for a laser diode array which can detect optical power fluctuations in its output in order to provide a mechanism to compensate for these fluctuations, thereby decreasing undesirable amplitude noise in the laser diode output.

Yet another object of the invention is to provide a feedback control system for a diode pumped laser system that detects an indication of the laser system operation.

Still another object of the invention is to provide a feedback control system for a diode pumped laser system that detects an indication of a damaged optical fiber link.

These and other objects of the invention are achieved in a diode pumped laser system that includes a laser cavity housing an active laser medium. A laser diode, with an emitter region, has an output facet that produces light at a wavelength of $\lambda_1$. A coupling optics is positioned in an emission path of radiation from the emitter region. It is optically spaced and coupled to the diode. The coupling optics produces stray radiation which is not included in the beam that is generated in the emission path. An optical fiber, having a first end and a second end, is oriented with respect to the coupling optics such that radiation from the emitter region is optically coupled into the optical fiber. The second end of the optical fiber is coupled to the laser cavity. A detector is positioned in a spaced, adjacent relationship to the coupling optics, in an emission path of the stray radiation. The detector detects at least a portion of the stray radiation, and produces a detected output in response to the stray radiation.

Also included is a signal processor that receives the detected output and produces a processed output which is a representation of a detected characteristic of the laser system. A filter can be positioned between the detector and the coupling optics. Stray light from the coupling optics is detected in a direction that is substantially perpendicular to the emission path of radiation of the emitter region.

The coupling optics can be a fiber, and the diode can be a diode array with a plurality of emitter regions. A power source supplies power to the diode pump source, and a controller is coupled to the power supply. The signal processor is coupled to the controller and a complete feedback system for the laser system is created.

DETAILED DESCRIPTION OF THE PREFERRED EMBODIMENTS

Figure 1:
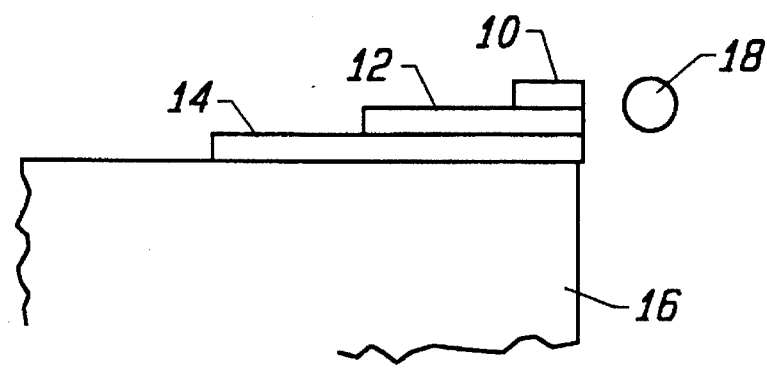
FIG. 1 is a side perspective view of a mounted laser diode pump source and a coupling optics.

Referring to FIG. 1, a laser diode source 10 is mounted on one or more diode submounts 12 and 14 respectively, with submount 14 being positioned on a diode heat spreader 16. Laser diode source 10 can be a single diode emitter with an emitter region having an output facet and produces light at a wavelength $\lambda_1$. It can have substantially any format, such as two or three dimensional, linear, circular, elliptical, rectangular, and the like. Laser diode source 10 can be a laser diode bar containing a plurality of laser diode emitters, with a plurality of emitter regions with output facets. For purposes of this disclosure, a diode array is a single multistripe emitter. A diode bar is an array or a multitude of arrays, e.g. multiple emitters. A bar can also be a very long array, such as 1 cm. By way of example, but not intended to limit the invention, laser diode bar 10 can include ten 1 W laser diode emitters contained on a 1 cm diode bar, each emitter having a 200 micron wide emission region, which is commercially available from Spectra Diode Laboratories, Inc., San Jose, Calif.

Coupling optics 18 are mounted to diode heat spreader 16. Use of coupling optics 18 to collimate laser diode source 10 before butt coupling to an optical fiber significantly improves coupling efficiency and permits the use of fibers with a low numerical aperture (NA), such as 0.1. Coupling optics 18 are employed to adjust the NA of a laser diode source to an intended application. Coupling optics can be any number of devices, including but not limited to, cylindrical or non-cylindrical cross-section fibers, spherically or aspherically cross section lenses or fibers, arrays of spherical, aspherical diffractive optical elements or other lenses, and arrays of reflective or prismatic surfaces. In one embodiment, coupling optics 18 is a piece of multi-mode optical fiber with a diameter that is about equal to the diameter of the optical fiber to be coupled laser diode source 10. By collimating the high NA direction of the emission from laser diode source 10, the butt coupled fiber can be located further away from laser diode source 10. This reduces the mechanical tolerances of the assembly.

Figure 2:
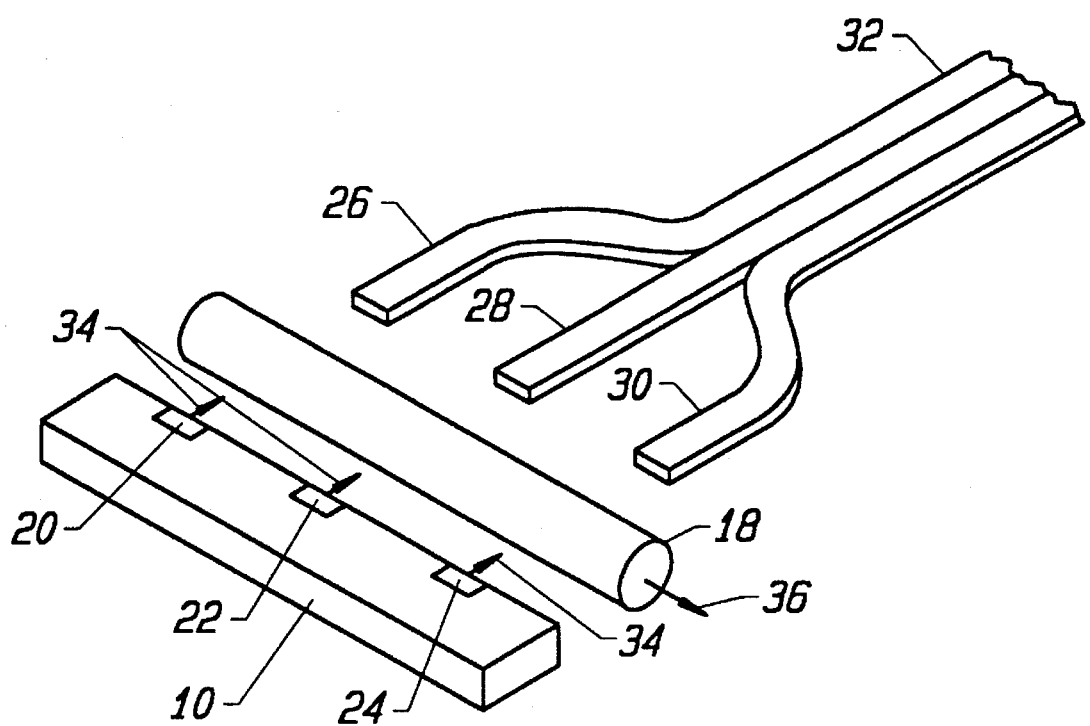
FIG. 2 is a perspective view of an arrangement for coupling the output from a laser diode bar into an optical fiber bundle.

In FIG. 2, an arrangement for coupling the radiation emitted from laser diode source 10, which is a single emitter region, a plurality of emitters or a bar, having a plurality of emitters 20, 22 and 24, into multi-mode optical fibers 26, 28 and 30, which may be part of an optical fiber bundle 32, includes placing a coupling optics 18 in between the emitter facets of emitters 20, 22 and 24, and the ends of multi-mode optical fibers 26, 28 and 30. It will be appreciated that it is not necessary to couple a certain number of laser diode emitters to an equal number of fibers, fiber bundles, or other optical transfer elements. It is possible to overlay power from more than one emitter to a smaller number of fibers, fiber bundles, or optical transfer elements. For purposes of this disclosure, optical transfer devices can extend beyond fibers and can be substantially any optical device or media, either reflective, refractive or open media which is placed at the output of laser diode source 10 to allow the output to be effectively coupled to a desired application. Air is only one of many transfer elements. Other suitable transfer elements include fluids, liquids, and solids.

A distance of approximately 60 microns from the near edge of coupling optics 18 to the diode facet is satisfactory for a 250 micron diameter fiber that has an index of refraction of 1.5. The optical spacing of the optical fiber end from coupling optics 18 should be as small as possible. In one embodiment, the spacing is about 20 microns.

In one embodiment, the diameter of coupling optics 18 is chosen to be roughly equal to the diameter of the optical fiber to be coupled. The diameter of coupling optics 18 may be chosen to be less than the diameter of the optical fiber to be coupled without loss in coupling efficiency. However, if such small coupling optics 18 diameters are used, the alignment of coupling optics 18 is made more difficult.

Coupling optics 18 is carefully placed with respect to the output facets of laser diode source 10 in order to properly collimate them. This may be accomplished by carefully aligning coupling optics 18 and securing it in place with a suitable epoxy, such as Tra-Bond 2151, available from Tra-Con, Medford, Mass.

The NA of the optical fiber to be coupled is chosen to be roughly equal to the low NA direction of diode source 10, typically 0.1 to 0.15. This combination of coupling optics 18 and optical fiber results in a percentage greater than 80% coupling of the laser diode emitted energy into the multi-mode optical fiber. Coupling optics 18 and the butt coupled end of the fiber may have anti-reflection coating to reduce reflections from these surfaces.

Coupling optics 18 can be cylindrical in cross-section. Those of ordinary skill in the art will recognize, however, that other cross-sectional shapes, including but not limited to, elliptical and hyperbolic, which can be useful for correction of particular spherical aberrations as known in the art, i.e., Kingslake, *Lens Design Fundamentals,* Academic Press, 1978.

As illustrated in FIG. 2, the optical fibers 26, 28 and 30 may be rectangular in cross-section in order to reduce the total amount of glass in the fiber. The width of such a rectangular fiber is preferably chosen to be slightly bigger than the diode emitting area. The height is chosen to be as small as possible, typically around 30 to 50 microns. Heights smaller than 30 to 50 microns may be used but make alignment more difficult. The diameter of coupling optics 18 is then preferably chosen to equal the height of the rectangle, 30 to 50 microns in the example given. The resulting fiber output is brighter since the total emission area is smaller.

Each emitter region 20, 22 and 24 produces collectively an emitter region emission path of radiation 34 that is optically coupled to optical fibers 26, 28 and 30. Stray radiation is emitted from coupling optics along a stray radiation emission path 36. In the embodiment illustrated in FIG. 2, stray radiation emission path 36 is generally perpendicular to emitter region emission path 34. The light that is transmitted along stray radiation emission path 36 is not used to pump the laser medium.

Figure 3:
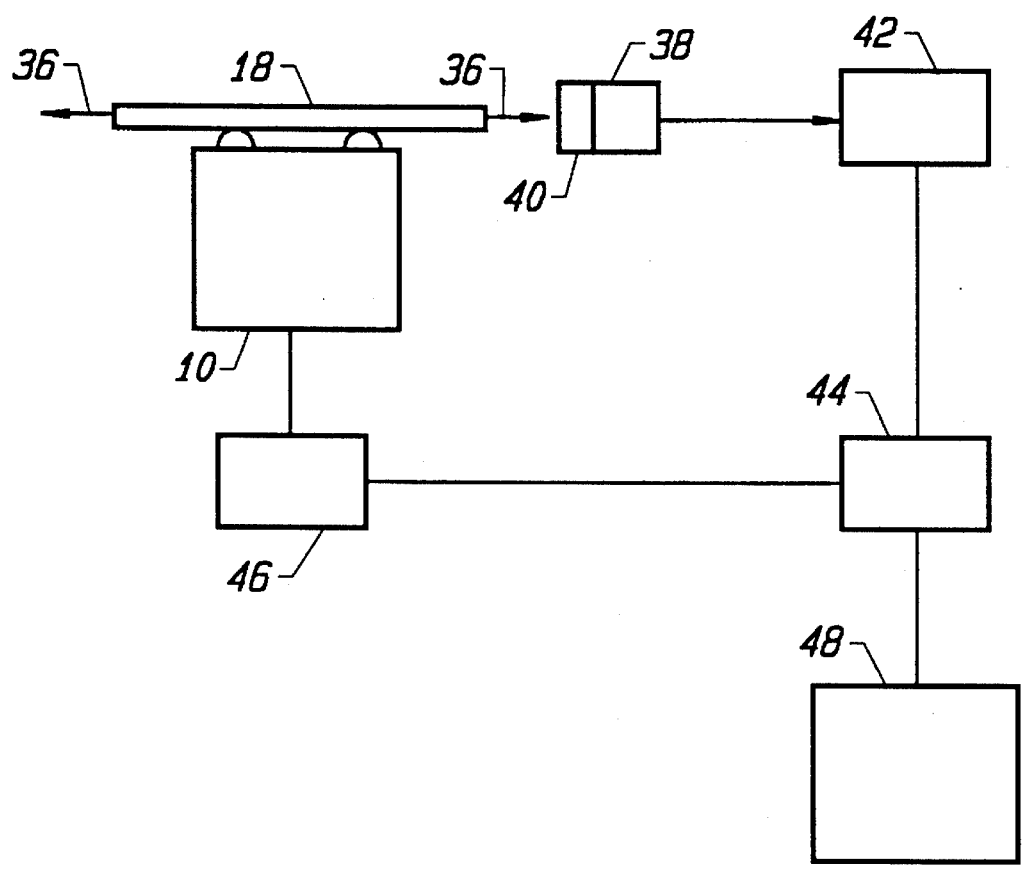
FIG. 3 is a block diagram of a feedback system of the invention with a mounted laser diode pump source and coupling optics which is shown as a fiber.

Referring now to FIG. 3, a detector 38 is positioned in a spaced, adjacent relationship to coupling optics 18, along stray radiation emission path 36. When coupling optics 18 is a fiber, detector 38 is positioned at one or both ends of the fiber. In an emission path of stray radiation which is generated by coupling optics 18. Detector 38 can be a semiconductor photodiode such as Centronics OS-15, Siemens BPW- 33, Germanium Power Devices Corp. GAP1000 or GM7, or any other suitable semiconductor photodiode manufactured of materials including but not limited to silicon, germanium, alloys of gallium arsenide, and the like. The photodiode can be included in an enclosed, packaged diode device, which are typical of single emitter diode units such as the SDL- 2300 series, available from Spectra Diode Laboratories, Inc., San Jose, Calif. Positioned between detector 38 and coupling optics 18 is a filter 40, such as an optical filter to eliminate visible light but pass infrared light. A suitable filter 40 is made of Schott RG850 optical filter glass, a 3×3×8 mm piece of 1% Nd:LiYF$_4$, Nd:YAG, Nd:YVO$_4$, Schott RG9 glass, Hoya RT-830 glass, as well as other similar glasses, optical devices or substrates coated to produce wavelength-selective transmission properties. Detector 38 can be attached to filter 40 to prevent variations due to alignment. Detector 38 detects at least a portion of the stray radiation from coupling optics 18, and produces a detected output in response to the stray radiation.

Coupled to detector 38 is a signal processor 42, including but not limited to a digital voltmeter, a sensitive amplifier with fixed or adjustable gain which can be comprised of inverting, noninverting amplifiers, comparators or difference amplifier components and frequency selective design where advantageous. Signal processor 42 receives the detected output from detector 38 and generates a processed output that is representative of a detected characteristic of the laser system associated with diode pump source 10. A controller 44 couples the processed output from signal processor 42 to a diode power supply 46. A suitable controller circuit is the controller circuitry in the T20 or T40 power supplies, Spectra-Physics Lasers, Mountain View, Calif. A computer 48 can be included and associated with controller 44. Computer 48 includes a CPU coupled through a system bus. This system bus can include a keyboard, disk drive, or other non-volatile memory systems, display, and other peripherals, as known in the art. Also coupled to the bus are a program memory and a data memory.

Figure 4:
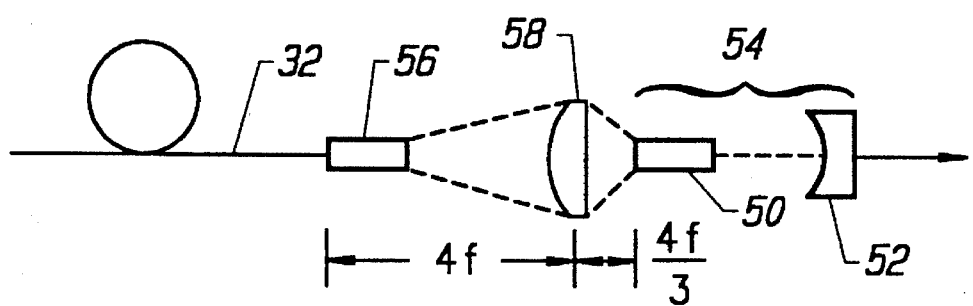
FIG. 4 is a block diagram of an embodiment of the invention used as a pump source for a laser system.

Referring now to FIG. 4, a bar 50 of doped solid state laser material and an output coupler 52 form a laser cavity 54. As will be appreciated by those of ordinary skill in the art, the end of laser cavity 54 may be a highly reflective coating on the face of bar 50. Optical fiber bundle 32, which laser diode radiation has been coupled from laser diode source 10, terminates in an output coupler 56, as is well known in the art. An imaging lens 58, having a focal length f, and is placed in the optical path of radiation from optical fiber bundle 32, at a distance 4f from the surface of output coupler 56 and at a distance 4f/3 from the face of bar 46 forming an end of laser cavity 54. The geometry disclosed in FIG. 4 is an end-pumped geometry, but it will be appreciated that the arrangement disclosed with respect to FIG. 4 can easily be used for side pumping a laser cavity with minimal and trivial rearrangement.

Referring again to FIG. 3, the detected output at signal processor 42 can produce a variety of different processed outputs. Such processed outputs can be representative of a detected characteristic of the laser system itself. Additionally, the device of the present invention has applications beyond a pump source for a laser. It can be used as an independent device for numerous applications, including but not limited to supplying optical power to be imaged for materials processing applications. Examples include surface treatment of materials, or for exposure of graphic arts media.

Laser diode output power and variations in output power may be detected as changes in the intensity of the light falling on the photodetector (photodiode). The incident light on the detector can be used to adjust and/or regulate the optical output of the laser diode array. It may also be used to provide a feedback signal which may be used to modify the current supplied to the laser diode or array in such a way that fluctuations in the laser output are reduced. An example of regulation and feedback is to use the electrical signals from the photodetector (photodiode) and, after suitable amplification and/or electronic filtering, introduce them into the circuitry that controls the current supply to the laser diode. If the signals are introduced in such a way as to additively cause the supplied current to the diode to adjust correctively in response to changes in the signal input, then the overall effect will be to cancel undesired fluctuations, often called noise, in the laser diode optical output. If laser diode wavelength control is desired, then the signals derived from a wavelength selective device that is used in conjunction with the detector, can be used to govern the adjustment of the temperature at which the laser diode is maintained. This is possible due to the temperature-sensitive nature of the semiconductor laser diodes in use today. Wavelength tuning by temperature is an accepted technique.

Some laser diode sources are used as pulsed excitation or light sources, and with this feedback implementation, it is also possible to monitor the actual light output under this mode of operation as well as provide the means to allow real-time adjustment to the current that is supplied to the laser diode during the light pulse. This can allow, but is not limited to, pulse shape tailoring of the light output, total integrated light output management, and pulse characteristic verification.

It is also possible to derive information regarding the wavelength characteristics of the laser diode source being monitored. The light impinging on the photodetector (photodiode) has wavelength information which can be analyzed by various mechanisms. Such mechanisms can include but are not limited to, transmissive or reflective gratings or their analogues, such as holographic substitutes, wavelength selective glasses or substrates with wavelength selective coatings. Alternatively, a medium or aggregate of media may be used which exhibit wavelength selective fluorescence or absorption of optical energy at or near desired output wavelengths of the laser diode or array. An example might be a sample of the same or a similar laser crystal medium which is to be excited or pumped by the laser diode light. The crystalline sample, under illumination at the proper wavelength, will exhibit marked increase or decreases in the light signal arriving at the detector, depending on whether fluorescence or absorption is the dominant optical mechanism exhibited due to such illumination. The light analyzed by intervening wavelength-selective elements will produce light variations on the detector which can be interpreted according to the wavelength of the light from the source. In such cases, it is also necessary to simultaneously obtain information about the overall power in the laser diode or array output in order to distinguish light variations according to power output and wavelength. The information obtained in this way can allow regulation of the temperature-sensitive wavelength of the laser diode or array output in order to optimally excite laser media or other media external to the laser diode or array which might be part of a wavelength-sensitive material or process.

Thus, the detected characteristic can be an indication of, (i) power output at laser diode source 10, (ii) wavelength emitted from laser diode source 10, (iii) laser system tuning, (iv) pulse output of the laser diode source if the laser system is pulsed, (v) power emitted from laser diode source 10, (vi) laser system operation and (vii) a damaged optical fiber link.

Figure 5:
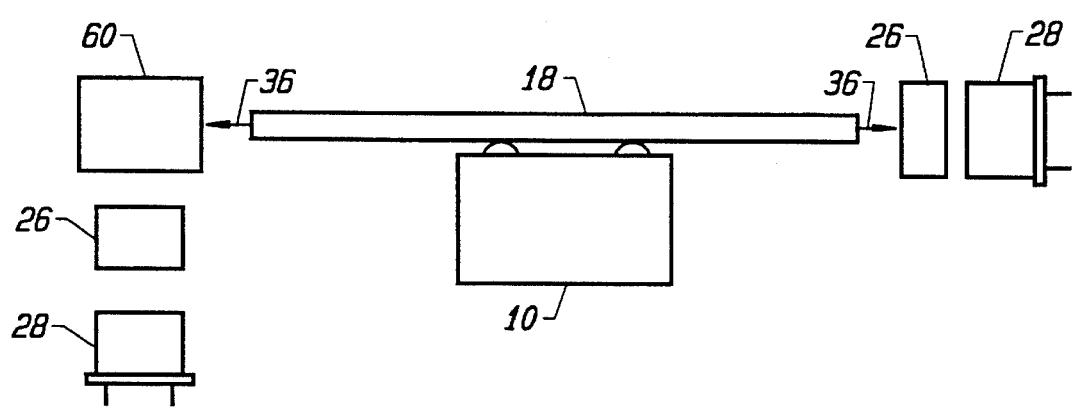
FIG. 5 is a block diagram of a collimating fiber with two detectors, each positioned at opposite ends of the fiber.

With reference now to FIG. 5, a wavelength monitoring system is illustrated. Positioned at one end of coupling optics 18 is a fluorescent device 60, made of a material that fluoresces when excited by light at the wavelength of interest; i.e., the desired pump wavelength for the laser medium pumped. Suitable materials include, but are not limited to, Nd:YLF and the like. An optical filter 26 is positioned adjacent to fluorescent device 60 and adjacent to the other end of coupling optics 18. Associated with each optical filter 26 is a photodiode 28. Optical filters 26 eliminate the pump light to a higher level so the relatively weak fluorescence signal can be detected.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

What is claimed is:

1. A diode pumped laser system, comprising:

a laser cavity including an active laser medium;

a laser diode with an emitter region having an output facet that produces light at wavelength $\lambda_1$;

coupling optics positioned in an emission path of radiation from the emitter region and optically coupled and spaced from the diode, the coupling optics including at least one imperfection which produces stray radiation in an emission path that is in a lateral direction relative to an optical axis of the laser cavity;

an optical fiber having a first end and a second end, the first end being oriented with respect to the coupling optics such that radiation from the emitter region is optically coupled into the optical fiber, the second end of the optical fiber being coupled to the laser cavity; and a detector positioned in a spaced, adjacent relationship to the coupling optics along the emission path of the stray radiation, to detect at least a portion of only the stray radiation, and produce a detected output in response to the stray radiation.

2. The laser system of claim 1, further comprising:

a signal processor that receives the detected output and produces a processed output that is representative of a detected characteristic of the laser system.

3. The laser system of claim 2, wherein the detected characteristic is an indication of power output at the laser diode wavelength $\lambda$.

4. The laser system of claim 2, wherein the detected characteristic is an indication of wavelength emitted from the laser diode.

5. The laser system of claim 2 wherein the detected characteristic is an indication of laser system tuning.

6. The laser system of claim 2 wherein the detected characteristic is an indication of a pulse output of the laser diode.

7. The laser system of claim 2 wherein the detected characteristic is a is an indication of power emitted from the laser diode.

8. The laser system of claim 2 wherein the detected characteristic is an indication of laser system operation.

9. The laser system of claim 2 wherein the detected characteristic is an indication of a damaged optical fiber link.

10. A diode pumped laser system, comprising:

a laser cavity including an active laser medium;

a laser diode bar having a plurality of emitter regions having output facets and producing light at wavelength $\lambda_1$;

a coupling optics with an axis oriented substantially perpendicular to and positioned in an emission path of radiation from the emitter regions to be optically coupled thereto, and spaced therefrom, the coupling optics producing stray radiation;

a plurality of optical fibers equal to the number of emitter regions of the laser diode bar, each of the plurality of optical fibers having a first end and a second end, each of the first ends oriented on axis with respect to the coupling optics such that radiation from the individual ones of the emitter regions is optically coupled into one or more individual fibers of the plurality of optical fibers, the second ends of each of the plurality of optical fibers arranged in a bundle;

a coupling device for coupling radiation from the bundle into the laser cavity; and a detector positioned in a spaced adjacent relationship to the coupling optics in an emission path of the stray radiation, to detect at least a portion of the stray radiation, and produce a detected output in response to the stray radiation.

11. The laser system of claim 10, further comprising:

a signal processor that receives the detected output and produces a processed output that is representative of a detected characteristic of the laser system.

12. The laser system of claim 11, wherein the detected characteristic is an indication of power output at the laser diode bar wavelength $\lambda$.

13. The laser system of claim 11, wherein the detected characteristic is an indication of wavelength emitted from the laser diode bar.

14. The laser system of claim 11, wherein the detected characteristic is an indication of laser system tuning.

15. The laser system of claim 11, wherein the detected characteristic is an indication of a pulse output of the laser diode bar.

16. The laser system of claim 11, wherein the detected characteristic is a is an indication of power emitted from the laser diode bar.

17. The laser system of claim 11, wherein the detected characteristic is an indication of laser system operation.

18. The laser system of claim 11, wherein the detected characteristic is an indication of a damaged optical fiber link.

19. The laser system of claim 11, further comprising:

a filter positioned between the detector and the coupling optics.

20. The laser system of claim 19, wherein the filter filters visible light and passes infrared light.

21. The laser system of claim 11 wherein the filter is made of optical filter glass.

22. The laser system of claim 11 wherein the filter is made of a laser medium.

23. The laser system of claim 21 wherein the laser medium is selected from Nd:LiYF$_4$, Nd:YLF, Nd:YVO$_4$, or Nd:YAG.

24. The laser system of claim 11 wherein the detector is a photodiode.

25. The laser system of claim 11 wherein the coupling optics is a cylindrical coupling optics.

26. The laser system of claim 11 wherein the coupling optics is an optical fiber.

27. The laser system of claim 25, wherein the stray light is emitted in a direction that is substantially perpendicular to the emission path of radiation from the emitter regions.

28. The laser system of claim 11 wherein the diode array is substituted for the diode bar.

29. The laser system of claim 11, further comprising:
 a power supply supplying power to the diode bar; and
 a controller coupled to the power supply.

30. The laser system of claim 29, wherein the signal processor is coupled to the controller.

31. A diode pumped apparatus, comprising:
 a laser diode bar having a plurality of emitter regions having output facets and producing light at wavelength $\lambda_1$;
 a coupling optics with an axis oriented substantially perpendicular to and positioned in an emission path of radiation from the emitter regions to be optically coupled thereto, and spaced therefrom, the coupling optics including at least one imperfection which produces stray radiation in an emission path that is in a lateral direction relative to an optical axis of the laser cavity;
 a plurality of optical fibers equal to the number of emitter regions of the laser diode bar, each of the plurality of optical fibers having a first end and a second end, each of the first ends oriented on axis with respect to the coupling optics such that radiation from the individual ones of the emitter regions is optically coupled into one or more individual fibers of the plurality of optical fibers, the second ends of each of the plurality of optical fibers arranged in a bundle;
 a coupling device for coupling radiation from the bundle into the laser cavity; and
 a detector positioned in a spaced adjacent relationship to the coupling optics along the emission path of the stray radiation, to detect at least a portion of the stray radiation, and produce a detected output in response to the stray radiation.

* * * * *